United States Patent [19]

Diedrich et al.

[11] 4,451,735

[45] May 29, 1984

[54] CRYOGENIC RADIATION DETECTOR WITH HIGH-DENSITY CONDUCTOR ARRAY

[75] Inventors: Heinz K. Diedrich; Giovanni Greco; Domenico Fanti, all of Rome, Italy

[73] Assignee: Selenia, Industrie Elettroniche Associate, S.p.A., Rome, Italy

[21] Appl. No.: 347,035

[22] Filed: Feb. 8, 1982

[30] Foreign Application Priority Data

Feb. 9, 1981 [IT] Italy .............................. 47753 A/81

[51] Int. Cl.³ .............................................. G01J 5/02
[52] U.S. Cl. .................................................. 250/352
[58] Field of Search ....................... 250/352, 338, 349; 374/80

[56] References Cited

U.S. PATENT DOCUMENTS

| | | | |
|---|---|---|---|
| 3,807,188 | 4/1974 | Lagodmos | 62/514 R |
| 4,059,764 | 11/1977 | Belasco et al. | 250/352 |
| 4,118,947 | 10/1978 | Diedrich et al. | 62/514 R |
| 4,206,354 | 6/1980 | Small, Jr. | 250/349 |
| 4,296,456 | 10/1981 | Reid | 361/403 |

*Primary Examiner*—Janice A. Howell
*Assistant Examiner*—Constantine Hannaher
*Attorney, Agent, or Firm*—Karl F. Ross; Herbert Dubno

[57] ABSTRACT

A detector for infrared radiation, having a multicell photosensor disposed at the top of a cold finger in an evacuated container, comprises a stack of annular ceramic layers coaxially surrounding the cold finger and serving as supports for several arrays of radially extending metallic strips screen-printed on respective layers in angularly offset relationship. The metallic strips are conductively connected to respective cells of the sensor to serve as output leads thereof. The conductive connections include axially extending metal pins spacedly surrounding the cold finger while being linked with the sensor cells by short, thin wires spanning an intervening annular gap.

11 Claims, 3 Drawing Figures

CRYOGENIC RADIATION DETECTOR WITH HIGH-DENSITY CONDUCTOR ARRAY

FIELD OF THE INVENTION

Our present invention relates to a radiation detector, especially one designed for infrared rays, in which a multiplicity of sensing elements closely juxtaposed with a heat sink lie within an evacuated container having a window enabling the focusing of such radiation upon these elements.

BACKGROUND OF THE INVENTION

In commonly owned U.S. Pat. No. 4,118,947 there has been disclosed a cryogenic container for an infrared-radiation detector in which a photosensitive unit mounted on an end face of a tubular "cold finger" has terminals connected to leads which are helically wound about that cold finger; the leads have extensions in the form of strip-line tracks traversing a nonmetallic peripheral wall of the container by way of a stack of annular layers forming a hermetic seal between axially adjoining wall sections. These layers consist at least in part of plastic material, though in one instance a ceramic layer is used. Opposite end faces of the stack may be metallized to facilitate its soldering to similarly metallized flanges of the two wall sections.

Useful as it is, the arrangement of the prior patent accommodates only a limited number of leads for the establishment of signal paths between the photosensitive unit and external circuitry serving for the evaluation of the incident radiation pattern. In many instances, including both industrial and military applications, a large number of sensing elements (e.g. between 50 and 180) are needed for a sufficiently detailed analysis of such a pattern. The device, therefore, must be provided with a corresponding number of leads which on the one hand should have the necessary electrical conductivity and on the other hand should be highly thermally resistant to minimize the passage of heat from the exterior to the photosensitive unit. Equally important is the maintenance of a hermetic seal around these leads at their points of penetration of the container wall.

OBJECTS OF THE INVENTION

The general object of our present invention, therefore, is to provide a radiation detector of the type referred to which satisfies the aforestated requirements.

A more particular object is to provide a detector of this character which is structurally simple and inexpensive to produce.

SUMMARY OF THE INVENTION

We have found, in accordance with our present invention, that an effective seal giving passage to a large number of sensor leads can be formed from a stack of two or more annular ceramic layers which are sintered together to constitute a solid body, at least one of these layers extending radially inward from the peripheral container wall to serve as a carrier for a multiplicity of radially arrayed thin conductor strips overlain by an adjoining ceramic layer of the stack leaving inner and outer ends of these strips exposed. The inner ends are galvanically connected by metallic leads to respective radiation-sensing elements of a photoelectric transducer closely juxtaposed with cooling means preferably disposed within the container, e.g. a heat sink such as the aforedescribed tubular cold finger comprising a cooled metallic cylinder. With the strip-supporting ceramic layer or layers closely approaching the heat sink, these leads need only bridge a relatively narrow intervening annular gap. Thus, the leads may be formed at least in part by very thin wires which do not conduct much heat and whose electrical resistance is limited by their short length.

Advantageously, pursuant to a more particular feature of our invention, the leads connecting the conductor strips to the terminals of the associated sensing elements also include a set of axially extending metal pins which rise from the strip-supporting ceramic layer and are spacedly distributed around the cold finger acting as the heat sink so as to be subjected to its cooling effect. With the ceramic stack axially offset from a transverse plane containing the sensing elements, i.e. from the focal plane of an optical system included in or juxtaposed with the radiation-transmitting window of the detector housing, the tips of the pins should lie substantially in this plane so that the aforementioned gap-bridging wires can be as short as possible.

According to another advantageous feature of our invention, the conductor strips are grouped into a plurality of annular arrays carried on progressively narrower ceramic layers of the stack in angularly offset relationship. This enables a denser distribution of the conductor strips and of their galvanic connections so as to accommodate a larger number of sensing elements.

If the container consists entirely of nonmetallic material such as glass, as shown in the above-identified prior patent, the ceramic stack could be bonded to adjoining sections of its peripheral wall by a soldering of respective metallic coatings as described in the prior patent. We prefer, however, to make these wall sections entirely metallic; this not only eliminates the need for a separate metallic coating but also effectively shields the conductor strips and their extension leads from extraneous electrical fields.

BRIEF DESCRIPTION OF THE DRAWING

The above and other features of our invention will now be described in detail with reference to the accompanying drawing in which.

SPECIFIC DESCRIPTION

Figure 1:
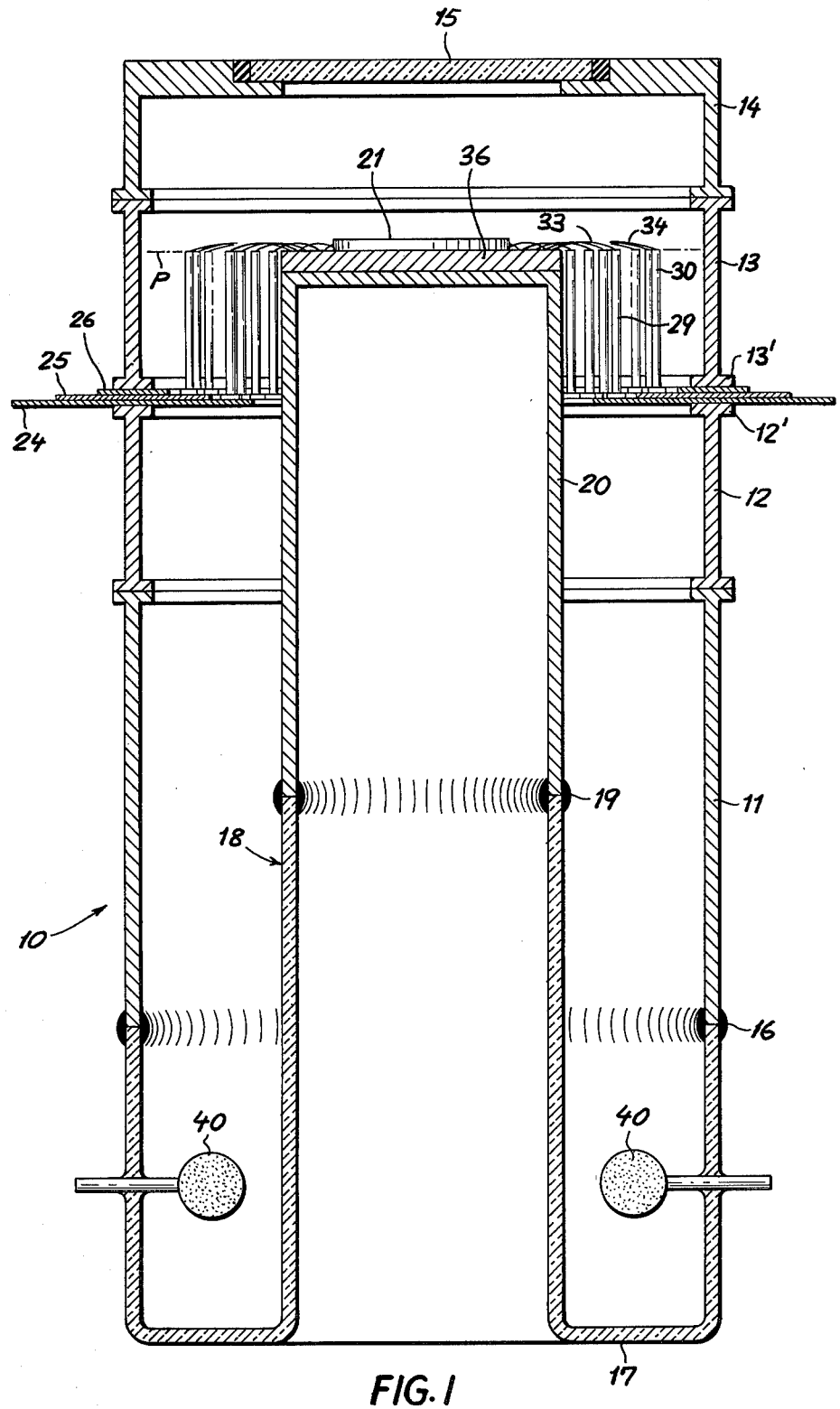
FIG. 1 is a sectional elevational view of a radiation detector according to our invention.

As shown in FIG. 1, a cylindrical container or housing 10 centered on a vertical axis has a peripheral wall with a metallic upper part divided into axially adjoining sections 11, 12, 13 and 14 which are joined together, preferably by soldering, once the internal components described hereinafter are assembled. Section 14 forms a cover provided with a window 15 which is transparent to the radiation to be detected, assumed to lie in the infrared portion of the spectrum. A nonillustrated lens above window 15 (or possibly incorporated into same) focuses such radiation onto a transverse plane P which lies approximately at the level of the joint between sections 13 and 14. Metal section 11 is bonded by a seal 16 to a glass wall 17 which forms the bottom of the detector housing and is integral with a lower part of a tubular cold finger 18 joined by a seal 19 to a metallic upper extension 20 of that finger. The closed top of that extension supports a photoelectric transducer 21 which lies in the focal plane P and consists of a multiplicity of radiation-sensing elements or cells that have not been individually illustrated. Thus, cold finger 18 and outer wall 11–17 define an essentially ring-cylindrical chamber which is evacuated through an exhaust connection not shown, the vacuum being maintained by several getters 40 in the lower part of the container.

Wall sections 12 and 13 are provided with respective inner annular flanges 12' and 13' by which they are soldered to respective metallic coatings 22, 23 (see FIGS. 2 and 3) on a lower and on an upper face of a stack of annular ceramic layers 24, 25, 26, e.g. of alumina, that are sintered into a unitary structure. The bottom layer 24, which has the greatest radial width, carries a first array of radial conductor strips 27 that are partly overlain by the narrower intermediate layer 25. The latter, in turn, carries a second array of radial conductor strips 28 partly overlain by the still narrower top layer 26. Conductor strips 27 and 28, whose thickness has been greatly exaggerated in FIG. 3, have exposed inner ends 27', 28' and outer ends 27", 28", the inner ends 27', 28' being broadened into enlarged circular patches. These strips, applied to their respective carrier layers by conventional screen printing, do not give rise to any gaps between the adjoining faces of the stacked ceramic layers.

The strips 27 and 28 advantageously consist of metals or alloys of low thermal conductivity such as molymanganese or tungsten. After the sintering of the stacked ceramic layers 24–26 into a solid body or modular unit, at temperatures well above 1,000° C., their exposed ends 27', 27" and 28', 28" are plated (e.g. with nickel) to facilitate their soldering to associated electrical connectors. These connectors include two sets of upstanding pins 29, 30, coaxially arrayed about cold finger 18, having heads bonded to patches 27', 28' and tips lying in or close to the focal plane P. Outer ends 27" of strips 27 are bonded to elbow-shaped metal tabs 31 leading to a nonillustrated external evaluation circuit; this circuit is also connected to the outer ends 28" of strips 28 by means of pins 32 passing through perforations 38 (FIG. 2) in these strips and in the underlying ceramic layers 24, 25. The metallic facings 22 and 23, which may also be produced by screen printing, may be subjected to the same plating step in order to facilitate their bonding to the respective flanges 12', 13'. These facings may consist of a copper/silver eutectic, for example.

Figure 2:
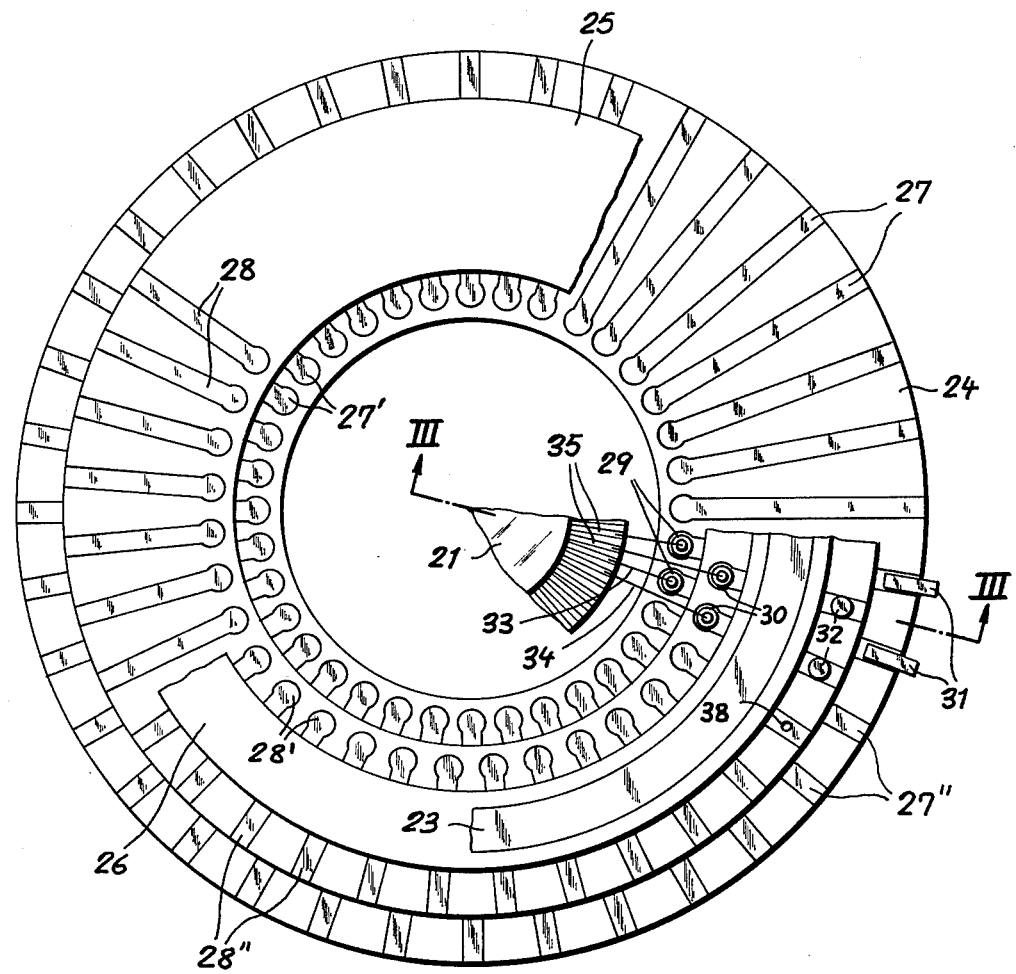
FIG. 2 is a top view of a conductor-supporting stack of the detector of FIG. 1, with parts broken away to expose different layers of its structure.
Figure 3:
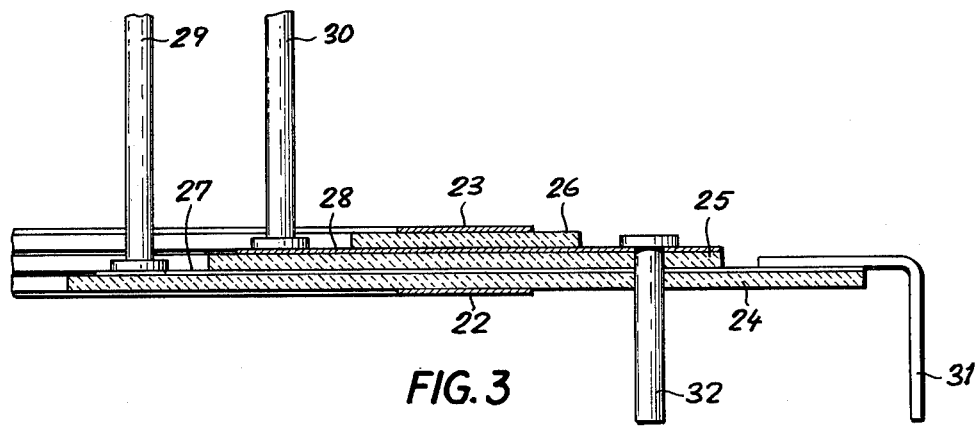
FIG. 3 is a sectional detail view taken on the line III—III of FIG. 2 but drawn to a larger scale.

As best seen in FIG. 2, the two sets of pins 29 and 30 are angularly staggered so that wires 33, 34, linking them with respective terminals 35 of transducer 21, are mutually interleaved. These wires may be extremely thin, with diameters ranging for instance between 25 and 50µ, and advantageously consist of a nickel-containing alloy, e.g. Ni/Cr, Ni/Cu or Ni/Fe/Co; such alloys are marketed, for example, under the names of Kovar and Vacon. Still, because of their reduced length, their electrical resistance may be substantially less than the output impedances of the radiation sensors which, with photoconductive elements of cadmium/mercury telluride, will be only about 50 ohms. A slight curving of the wires during installation will allow their contraction of cryogenic temperatures. The diameters of pins 29 and 30 can, of course, be substantially larger since there is no significant heat gradient in the axial direction. The pins 29, 30 and the terminals 35 can also be made of alloys such as Kovar and Vacon to facilitate their connection to wires 33, 34 by a gap-welding process; similar alloys may be used for the metallic housing sections 11–14 as well as for a sensor-supporting substrate 36 on the end face of cold finger 18 which may be part of a ground return (not otherwise shown) for all sensors.

The heat sink 18 is cooled by a nonillustrated external refrigeration unit as is well known per se (see, for example, U.S. Pat. No. 3,807,188), e.g. to a range of 70°–190° K.

We have found that a radiation detector of the type here disclosed can operate with thermal-conduction power losses of less than 10 mW per 100 sensing elements.

We claim:

1. A radiation detector comprising:
an evacuated container with an external boundary partly constituted by two axially aligned generally cylindrical metallic peripheral wall sections;
a cooled metallic cylinder extending axially within said wall sections and defining therewith an annular space, said cylinder having a closed end disposed in a transverse plane;
photoelectric transducer means including a multiplicity of radiation-sensing elements disposed on said closed end in a central area of said container and confronted by a radiation-transparent window thereof parallel to said transverse plane;
a stack of annular ceramic layers surrounding said cylinder at a location axially offset from said transverse plane, said stack being sintered into a solid body which forms part of a hermetic seal joining said wall sections to each other;
a multiplicity of thin conductor strips radially arrayed on a surface of at least one of said layers extending inward from said wall sections toward said cylinder, each conductor strip being partly overlain by an adjoining layer of said stack leaving an inner and an outer end of the strip exposed; and
a multiplicity of metallic leads in said space galvanically connecting the exposed inner ends of said conductor strips to respective radiation-sensing elements of said transducer means, each of said leads including a metal pin extending axially from the inner end of the respective strip to substantially said transverse plane and further including a radially oriented wire substantially thinner than said pin extending from a tip of said pin to a respective radiation-sensing element across a narrow annular gap separating the pins of said leads from said cylinder, said wire normally having a curvature sufficient to enable its contraction at cryogenic temperatures.

2. A radiation detector as defined in claim 1 wherein said stack includes a relatively wide layer carrying a first array of said conductor strips, a narrower layer partly overlying the strips of said first array and carrying a second array of said conductor strips, and a still narrower layer partly overlying the strips of said second array.

3. A radiation detector as defined in claim 2 wherein the strips of said first array are angularly offset from those of said second array.

4. A radiation detector as defined in claim 1, 2 or 3 wherein said leads consist essentially of a nickel-containing alloy.

5. A radiation detector as defined in claim 1, 2 or 3 wherein said radiation-sensing elements are supported on said closed end by a substrate of nickel-containing alloy.

6. A radiation detector as defined in claim 1, 2 or 3 wherein said wall sections are provided with confronting end flanges soldered onto respective metallic coatings on opposite end faces of said stack.

7. A radiation detector as defined in claim 1, 2 or 3 wherein the interior of said container is provided with gas-absorbing getter means.

8. A radiation detector as defined in claim 1, 2 or 3 wherein said wire has a diameter between substantially 25 and 50μ.

9. A radiation detector as defined in claim 8 wherein said wire consists of a nickel-containing alloy.

10. A radiation detector as defined in claim 9 wherein said wire is short enough to have an electrical resistance substantially less than 50 ohms.

11. A radiation detector as defined in claim 6 wherein an extremity of said container remote from said window is formed by a glass section with an outer wall joined by a first seal to said external boundary and with an inner wall joined by a second seal to said cylinder.

* * * * *